(12) United States Patent
Przybysz et al.

(10) Patent No.: US 10,749,096 B2
(45) Date of Patent: Aug. 18, 2020

(54) CONTROLLING A STATE OF A QUBIT ASSEMBLY VIA TUNABLE COUPLING

(71) Applicants: Anthony Joseph Przybysz, Linthicum, MD (US); Joel D. Strand, Ellicott City, MD (US)

(72) Inventors: Anthony Joseph Przybysz, Linthicum, MD (US); Joel D. Strand, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/886,602

(22) Filed: Feb. 1, 2018

(65) Prior Publication Data

US 2019/0237648 A1    Aug. 1, 2019

(51) Int. Cl.
| | | |
|---|---|---|
| *H03K 3/38* | (2006.01) | |
| *H01L 39/04* | (2006.01) | |
| *B82Y 10/00* | (2011.01) | |
| *G06N 10/00* | (2019.01) | |

(52) U.S. Cl.
CPC ............ *H01L 39/045* (2013.01); *B82Y 10/00* (2013.01); *G06N 10/00* (2019.01)

(58) Field of Classification Search
None
See application file for complete search history.

(56) References Cited

U.S. PATENT DOCUMENTS

| | | |
|---|---|---|
| 4,800,345 A | 1/1989 | Podell et al. |
| 5,552,735 A | 9/1996 | Kang et al. |
| 5,818,308 A | 10/1998 | Tanaka et al. |
| 6,346,863 B2 | 2/2002 | Sasaki et al. |
| 6,407,647 B1 | 6/2002 | Apel et al. |
| 6,636,126 B1 | 10/2003 | Pozdeev |
| 6,747,525 B2 | 6/2004 | Iida et al. |
| 6,765,455 B1 | 7/2004 | De Lillo et al. |
| 6,806,558 B2 | 10/2004 | Apel |
| 7,969,178 B2 * | 6/2011 | Przybysz ............... G06N 10/00 326/5 |
| 8,928,391 B2 | 1/2015 | Naaman et al. |

(Continued)

FOREIGN PATENT DOCUMENTS

| | | |
|---|---|---|
| EP | 2730029 A2 | 5/2014 |
| JP | 2013-058705 A | 3/2013 |

(Continued)

OTHER PUBLICATIONS

International Search Report corresponding to International application No. PCT/US2019/012068 dated Mar. 25, 2019.

(Continued)

*Primary Examiner* — Ali Naraghi
(74) *Attorney, Agent, or Firm* — Tarolli, Sundheim, Covell & Tummino LLP

(57) ABSTRACT

Methods and apparatuses are provided for controlling the state of a qubit. A qubit apparatus includes a load, a qubit, and a compound Josephson junction coupler coupling the qubit to the load. A coupling controller controls the coupling strength of the compound Josephson junction coupler such that a coupling between the qubit and the load is a first value when a reset of the qubit is desired and a second value during operation of the qubit.

13 Claims, 4 Drawing Sheets

(56) References Cited

U.S. PATENT DOCUMENTS

| | | | |
|---|---|---|---|
| 9,257,736 | B1 | 2/2016 | Josypenko |
| 9,647,662 | B1 | 5/2017 | Abutaleb et al. |
| 9,710,758 | B2 | 7/2017 | Bunyk et al. |
| 9,768,771 | B2 | 9/2017 | Naaman |
| 9,928,948 | B2 | 3/2018 | Naaman et al. |
| 10,042,805 | B2 | 8/2018 | Naaman et al. |
| 2003/0218516 | A1 | 11/2003 | Gilbert et al. |
| 2004/0189388 | A1 | 9/2004 | Nguyen et al. |
| 2006/0147154 | A1 | 7/2006 | Thom et al. |
| 2006/0220737 | A1 | 10/2006 | Sanderson |
| 2008/0048762 | A1 | 2/2008 | Inamdar et al. |
| 2009/0078931 | A1 | 3/2009 | Berkley |
| 2009/0189712 | A1 | 7/2009 | Jiang |
| 2010/0148853 | A1* | 6/2010 | Harris ............... G06N 10/00 327/528 |
| 2011/0054876 | A1 | 3/2011 | Biamonte et al. |
| 2013/0009677 | A1* | 1/2013 | Naaman ............. G06N 10/00 327/113 |
| 2015/0254571 | A1 | 9/2015 | Miller et al. |
| 2015/0263736 | A1* | 9/2015 | Herr .................. G06N 10/00 326/4 |
| 2016/0335558 | A1 | 11/2016 | Bunyk et al. |
| 2016/0335560 | A1 | 11/2016 | Mohseni et al. |
| 2017/0127205 | A1 | 5/2017 | Lin |
| 2017/0201224 | A1 | 7/2017 | Strong et al. |
| 2017/0286859 | A1 | 10/2017 | Harris et al. |
| 2018/0091115 | A1 | 3/2018 | Abdo |
| 2019/0007051 | A1 | 1/2019 | Sete et al. |

FOREIGN PATENT DOCUMENTS

| | | |
|---|---|---|
| JP | 5363993 B2 | 12/2013 |
| WO | 98/36467 | 8/1998 |
| WO | 9836467 | 8/1998 |
| WO | 20100028183 A1 | 3/2010 |
| WO | 2014028302 A2 | 2/2014 |
| WO | 2017062143 A1 | 4/2017 |
| WO | 20170058194 A1 | 4/2017 |
| WO | 2017/111949 | 6/2017 |
| WO | 2017127205 A1 | 7/2017 |
| WO | 2017022806 A1 | 11/2017 |
| WO | 2017/222806 | 12/2017 |

OTHER PUBLICATIONS

Australian Search Report corresponding to Australian Patent Application No. 2016388350, dated Jan. 7, 2019.

Chen,Y. et al. "Qubit architecture with high coherence and fast tunable coupling." Physical review letters 113.22 2014):2205022.

Written Opinion and Search Report corresponding to International Application No. PCT/US2019/014796 dated Apr. 26, 2019.

Anonymous: What is the self-resonant frequency of a capacitor?, May 22, 2017, XP055582197,Retrieved from the Internet:URL:https://www.quora.com What-is-the-self-resonant-frequency-of-a-capacitor[retrieved on Apr. 17, 2019] the whole document.

Tuori et al: 11 Efficient protocol 1-20 for qubit initialization with a tunable environment, arxiv .org, Cornell University Li Bra Ry, 201 Olin Library Cornell University Ithaca, NY 14853,Dec. 13, 2016 Dec. 13, 2016'XP080743892,DOI: 10.1038/S41534-017-0027-1 abstract; figures 1-6 p. 1, line 1-p. 6, last line p. 8, line 1-p. 11, last line p. 13, 1ine 10-p. 16, last line.

Robertson et al: "Superconducting device to isolate,entangle, and read out quantum flux states", Mar. 21, 2016, pp. 1-4,ResearchGate Retrieved from the Internet: IRL:https://www.researchgate.net/publication/255276503, Superconducting device to isolate entangle and read out quantum flux states[retrieved on Sep. 27, 2018]abstract; figures 1-4 p. 1, left-hand column, line 1-p. 4,right-hand column, last line.

Kafri:"Tunable inductive coupling of superconducting qubits in the Srongly nonlinear regime",arXiv:1606.08382v2,Jan. 23, 2017 (Jan. 23, 2017), xP055469297,Retrieved from the internet:URL:https://arxiv.orgabs1606.08382v2[retrieved on Apr. 20, 2018]abstract; figures 1-3 p. 1, line 1-p. 22, last line.

Schmitt et al: "Multiplexed readout of transmon qubits with Josephson Bifurcation amplifiers",Physical Review A (Atomic, Molecular, and Optical Physics),vol. 90, No. 6, Dec. 1, 2014 (Dec. 1, 2014), XP055511194, USA ISSN: 1050-2947, DOI: 10.1103/PhysRevA.90.062333 abstract; figures 1-4 p. 1, Left-hand column, line 1-p. 4,right-hand column, line 25.

Harris, et al.: "A Compound Josephson Junction Coupler for Flux Qubits for Flux Qubits with Minimal Crosstalk"; found on the internet on Jan. 30, 2018 at: https://arxiv.org/abs/0904.3784; submitted Apr. 24, 2009; pp. 1-5.

Chen et al.: "Qubit Architecture with High Coherence and Fast Tunable Coupling", Physical Review Letters, US, (Nov. 26, 2014), vol. 113, No. 22, doi:10.1103/PhysRevLett.113.220502, ISSN 0031-9007.

Ehara, et al.: "Development of Pulse Transfer Circuits for Serially Biased SFQ Circuits Using the Nb 9-Layer 1um Process", IEEE Transactions on Applied Superconductivity, IEEE Service Center (Jun. 1, 2013), vol. 23, No. 3, p. 1300504.

International Search Report from corresponding PCT/US2019/012065, dated May 17, 2019.

International Search Report from corresponding PCT/US2019/018497; dated May 15, 2019.

Lu: "Master Thesis Towards Tunable Coupling Between Two Superconducting Transmission Line Resonators"; Aug. 24, 2012 (Aug. 24, 2012), XP055585125, Retrieved from the Internet:URL:https://www.wmi.badw.de/publications/theses/Xiaoling, Lu Master Thesis 2012.pdf [retrieved on May 2, 2019]; abstract, section 1, section 2, section 3, section 4.

Rafique et al.: Tunable filter based on DC-SQUID chain 1; May 1, 2007 (May 1, 2007), pp. 1-2, XP055585121, DOI: 10.13140/RG2.1.1612.5688, Retrieved from the Internet: URL:https://www.researchgate.net/profile/RaihanRafique2/publication/305769905 Tunable filter based on DC SQUID chain/links/57a07d4408ae94f454eb0968/Tunable-filter-based-on-DC-SQUID-chain.pdf [retrieved on May 2, 2019].

Tuorila et al: "Efficient protocol for qubit initialization with a tunable environment", arxiv.org, Cornell University Library, 201, Olin Library Cornell University Ithaca, NY 14853, Dec. 13, 2016 (Dec. 13, 2016), XP080743892, DOI: 10.1038/S41534-017-0027-1; abstract, figures 1-3, p. 1, line 1-p. 7, last line.

Final Office Action for U.S. Appl. No. 15/868,557 dated Jul. 25, 2019.

Japanese Office Action for Application No. 2018-533894 dated Aug. 20, 2019.

Non Final Office Action for U.S. Appl. No. 15/866,602 dated Aug. 21, 2019.

Non Final Office Action for U.S. Appl. No. 16/255,588 dated Sep. 5, 2019.

Fabio Chiarello, et al: Superconducting tunable flux qubit with direct readout scheme: Superconducting tunable flux qubit with direct readout scheme:. Superconductor Science and Technology, IOP Publishing,K Techno House, Bristol, GB, vol. 18, No. 10, Oct. 1, 2005, pp. 1370-1373, XP020087996, ISSN: 0953-2048, DOI: 10.1088/0953-2048/18/10/021 Sections 1-3; figures 1, 2.

International Search Report for International Application No. PCT/US2019/036576 dated Oct. 24, 2019.

International Search Report for International Application No. PCT/US2019/035607 dated Oct. 1, 2019.

G. Samach, et al.: "Coupled qubits for next generation quantum annealing: novel interactions", Abstract submitted to the APS March Meeting 2017, Jan. 4, 2017, XP055469301, Retrieved from the Internet: URL: http://absimage.aps.org/image/MAR17-2016-003302.pdf, abstract.

Ferguson et al: "Non-stoquastic XX couplers for superconducting flux qubits", Abstract submitted to the APS March Meeting 2017, Jan. 4, 2017, XP055469302, Retrieved from the Internet: URL: http://absimage.aps.org/image/Mar17/MWS_Mar17-2016-008291.pdf, abstract.

International Search Report for International Application No. PCT/US2018/015729 dated May 2, 2018.

(56) References Cited

OTHER PUBLICATIONS

Lanting et al: "Cotunneling in pairs of coupled flux qubits", Physical Review B, vol. 82, 060512R, Aug. 23, 2010, XP055469296, figures 1(a) & (b).
Harris R et al: "Sign- and magnitude-tunable coupler for superconducting flux qubits", arxiv.org, Cornell University Library, 201 Olin Library Cornell University Ithaca, NY 14853, Aug. 11, 2006 (Aug. 11, 2006), XP080248067, DOI: 10.1103/PHYSREVLETT.98.177001 figure 1.
Kang H et al: "Current recycling and SFQ signal transfer in large scale RSFQ circuits", IEEE Transactions on Applied Superconductivity, IEEE Service Enter, Los Alamitos, CA, US, vol. 13, No. 2, Jun. 1, 2003 (Jun. 1, 2003), pp. 547-550, XP011097824, ISSN: 1051-8223, DOI: 10. 1109/TASC.2003.813932 figure 2.
Ehara K et al: "Development of Pulse Transfer Circuits for Serially Biased SFQ Circuits Using the Nb 9-Layer 1- $\mu\hbox{m}$ Process", IEEE Transactions on Applied Superconductivity, IEEE Service Center, Los Alamitos, CA, US, vol. 23, No. 3, Jun. 1, 2013 (Jun. 1, 2013), p. 1300504, XP011513813, ISSN: 1051-8223, DOI: 10. 1109/TASC.2012.2233535 figure 1.
Yu Chen et al: "Qubit Architecture with High Coherence and Fast Tunable Coupling", Physical Review Letters, vol. 113, No. 22, Nov. 26, 2014 (Nov. 26, 2014), XP055403674, US ISSN: 0031-9007, DOI: 10.1103/PhysRevLett.113.220502 figure 1.
International Search Report for International Application No. PCT/US2017/036169 dated Sep. 25, 2017.
International Search Report for International Application No. PCT/US2019/012049 dated Dec. 4, 2019.
Worsham A H et al: "A Single Flux Quantum cross-bar switch and demultiplexer" IEEE Transactions on Applied Superconductivity, IEEE Service Center, Los Alamitos, CA, US, vol. 5, No. 2, Jun. 1, 1995 (Jun. 1, 1995), pp. 2996-2999, XP011504599, ISSN: 1051-8223, DOI: 10.1109/77.403222 Section II.; figure 1.

* cited by examiner

CONTROLLING A STATE OF A QUBIT ASSEMBLY VIA TUNABLE COUPLING

This invention was made with Government support under Contract No. 30059298. The Government has certain rights in this invention.

TECHNICAL FIELD

The present invention relates generally to quantum computing systems, and more particularly to a managing a state of a qubit assembly.

BACKGROUND

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability means that a quantum computer can solve a large class of problems with exponentially greater efficiency than that of a classical computer.

SUMMARY

In accordance with one example, a qubit apparatus is provided. The qubit apparatus includes a load, a qubit, and a compound Josephson junction coupler coupling the qubit to the load. A coupling controller controls the coupling strength of the compound Josephson junction coupler such that a coupling between the qubit and the load is a first value when a reset of the qubit is desired and a second value during operation of the qubit.

In accordance with another example, a method is provided for operating a qubit. A first value of a control flux is provided to a tunable coupler linking the qubit and a dissipative element such that the qubit is substantially isolated from the dissipative element. A quantum operation is performed at the qubit. A second value of the control flux is provided to the tunable coupler such that the qubit is coupled to the dissipative element. A reset time is allowed to elapse while the qubit relaxes to a ground state while coupled to the dissipative element.

In accordance with a further example, a qubit apparatus is provided. The qubit apparatus includes a load, comprising a circuit element having an impedance with a non-vanishing real part, a qubit, a compound Josephson junction coupler coupling the qubit to the load. A coupling controller controls the coupling strength of the compound Josephson junction coupler such that a coupling between the qubit and the load is a first value, providing a strong coupling between the qubit and the load, when a reset of the qubit is desired and a second value, the second value represents substantial isolation of the qubit from the load, during operation of the qubit.

DETAILED DESCRIPTION

Solid state quantum bits ("qubits") encode information in quantized excitations of a macroscopic degree of freedom in objects such as semiconducting quantum dots, SQUIDs, or other superconducting devices. In any quantum computer, it is desirable to initialize the quantum bits to a known state with high fidelity. In some architectures, the physical qubits can be recycled throughout the computation, such that the application is sensitive to the speed of the reset operation. A solid state qubit, in accordance with an aspect of the present invention, has the ability to initialize the system in a known state with high fidelity, a process referred to herein as a "reset" of the qubit. In one implementation, the qubit is initialized in the ground state. A related process is the removal of unwanted thermal excitations from the qubit. In this process, referred to herein as "cooling" the qubit, the excited state population of the qubit is reduced to below thermal levels.

The present disclosure relates generally to superconducting circuits, and more particularly to a fast reset or cooling scheme that involves coupling the qubit to a dissipative environment via a tunable coupler, allowing for selective reset or cooling of the qubit. It is often desirable to reuse a qubit in an algorithm, which is expedited by an efficient method for initializing the qubit in the ground state. Since long qubit lifetimes are also desirable, it is intractable to wait out the qubit lifetime to allow the qubit to decay naturally. Therefore, a method is provided for qubit reset that can initialize the qubit quickly, but will not deleteriously effect the qubit lifetime during operation. An external bias tunes the coupling between the qubit and the environment, with the bias idling at a point such that the qubit is isolated from the environment, preserving the qubit lifetime. Fast DC pulses on the external bias are used to activate the coupler when it is desirable to reset the qubit.

Figure 1:
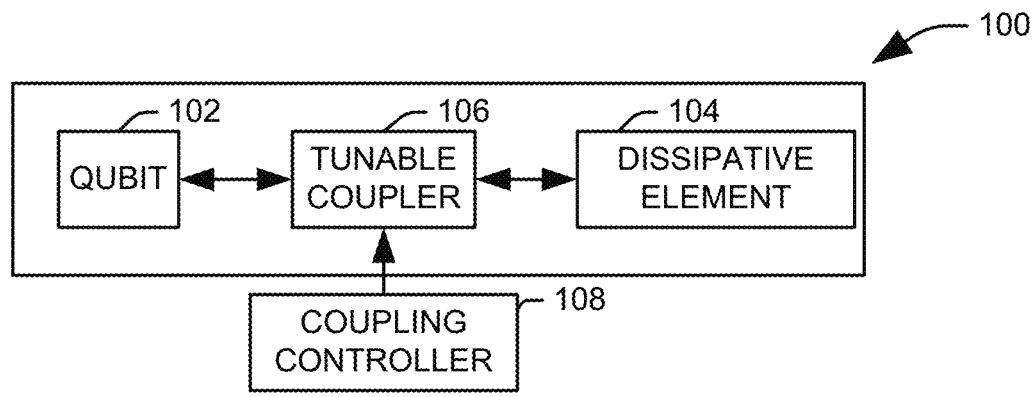
FIG. 1 illustrates a functional block diagram of a qubit assembly in accordance with an aspect of the present invention.

FIG. 1 illustrates a functional block diagram of a qubit assembly 100 in accordance with an aspect of the present invention. The qubit assembly 100 comprises a qubit 102 coupled to a dissipative element 104 via a tunable coupler 106. The qubit 102 can include any physical assembly having a plurality of energy states that are tunable in response to a control mechanism (not shown). For example, the qubit cell can be implemented as an oscillator that can transfer energy between some combination of an electric field of a capacitor, a magnetic field of an inductor, and one or more superconducting Josephson junctions, such that the qubit cell can include one or more of a charge qubit, a flux qubit, and a phase qubit. Exemplary implementations of a qubit cell can include one or more of a Josephson junction, a quantum dot, a SQUID (superconducting quantum interference device), a Cooper pair box, and an ion trap. It will be further appreciated that the term "coupled" is intended to encompass not only a means of physical coupling, such as a mechanical coupling by means of an electrical conductor, but also any other appropriate coupling means including capacitive, inductive, magnetic, nuclear, and optical coupling, or any combination of the foregoing.

The tunable coupler 106 can include any appropriate structure for selectively isolating the qubit 102 from the dissipative element 104. In one implementation, the tunable coupler is an RF-SQUID with a small inline DC-SQUID, known as a compound Josephson junction (CJJ), which acts as a tunable mutual inductance between two elements 102 and 104. The magnetic susceptibility of the coupler can be tuned by applying flux to either the main inductor of the RF-SQUID or to the CJJ. Using this coupler 106, a tunable mutual inductance can be changed in situ. The tunable coupler 106 can be controlled via a coupling controller 108 that controls the coupling strength of the compound Josephson junction. For example, the coupling controller 108 can tune the mutual coupling at the tunable coupler 106 between a first value, representing a strong coupling between the qubit 102 and the dissipative element 104, for example, a mutual inductance between twenty and four hundred fifty picohenries, and a second value, representing substantial isolation of the qubit from the dissipative element, such as a mutual inductance near zero. The coupling controller 108 can utilize single flux quantum (SFQ) logic (e.g., reciprocal quantum logic (RQL) logic), and/or conventional logic. In one implementation, one or more fast DC pulses can be applied via a coupler control line (not shown) to turn on the coupler and reset the qubit. During qubit operation, the coupler will be DC biased and held in a state providing near zero coupling. This allows for a controllable reset of the qubit 102 to the ground state quickly without having an undesired, deleterious effect on the qubit lifetime.

In one implementation, the dissipative element 104 can comprise a circuit element, referred to herein as a load, that receives the energy stored in the qubit 102 when the mutual coupling between the qubit and the dissipative element is strong. Essentially the qubit control 108 can tune the qubit 102 to discharge its associated quantum state along the tunable coupler 106 to provide it to the circuit element. In such a case, the dissipative element 104 can comprise any element having a non-vanishing real impedance to which it is desirable to provide a single photon input. For example, said circuit element can be an amplifier, a detector, a fiber coupler, an opto-modulator, a beam splitter, or similar component. It will further be appreciated that the qubit assembly 100 can be used with resonators, other qubits, or other qubit assemblies having the fast cooling and reset configuration of the illustrated qubit assembly.

Figure 2:
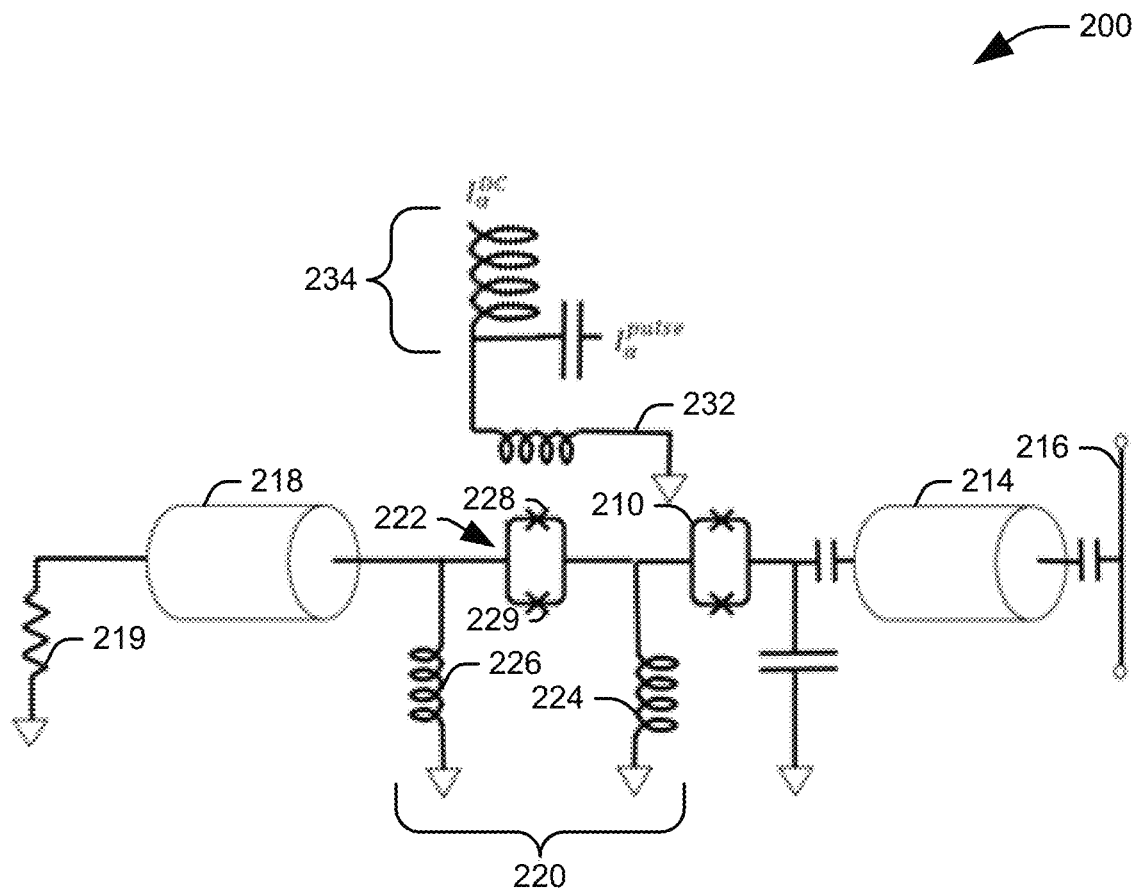
FIG. 2 illustrates a schematic of one example of a circuit for reading a state of a qubit.

FIG. 2 illustrates a schematic of one example of a circuit 200 for reading a state of a qubit. The circuit 200 includes a transmon qubit 210, a readout resonator 214, a feedline 216, a transmission line 218, a resistive load 219, and a tunable compound Josephson junction (CJJ) coupler 220, comprising a superconducting loop interrupted by a CJJ 222 to form a radio frequency (RF) superconducting SQUID. The tunable compound Josephson junction (CJJ) coupler 220 includes a first inductor 224 in the superconducting loop that provides a mutual inductance, $M_q$, to the qubit 210 via a galvanic connection, and a second inductor 226 that provides a mutual inductance, $M_r$, to the transmission line 218 leading to the resistive load 219 via a galvanic connection. In the illustrated implementation, the CJJ 222 includes two identical Josephson junctions 228 and 229.

A flux, $\Phi_a$, can be applied to the CJJ 222 by applying current to a control line 232, with a bias tee 234 on the control line available to allow for both DC and pulsed signals to be applied to the coupler. Since current provided to the control line 232 does not generate current in the superconducting loop when the junctions 228 and 229 in the CJJ 222 are identical, the qubit 210 is protected from dissipation caused by this line. The coupler represents an effective mutual inductance, $M_{\it{eff}}=M_qM_r x$, where x is the magnetic susceptibility of the coupler. The magnetic susceptibility is a function of the flux applied to the CJJ 222, which can be expressed as:

$$\chi(\Phi_a) = \frac{\beta_{\it{eff}}(\Phi_a)}{L_{co}(1 + \beta_{\it{eff}}(\Phi_a))} \qquad \text{Eq. 1}$$

where it is assumed that $L_{co}$ is the total geometrical inductance of the coupler, $$\beta_{\it{eff}}(\Phi_a) = \frac{2\pi L_{co} I_c}{\Phi_0} \cos\left(\frac{\pi \Phi_a}{\Phi_0}\right),$$

$\Phi_0$ is the magnetic flux quantum, approximately equal to 2.07 femtowebers, and $I_c$ is the combined critical current of the two junctions in the CJJ 222.

Using the control line 232, the effective mutual inductance, $M_{\it{eff}}$, between the qubit 210 and the resistive load 219 can be tuned to allow for selective reset of the qubit state. Since the qubit lifetime is a function of this mutual inductance, we isolate the qubit from the environment by setting $M_{\it{eff}}=0$ and reset it by turning up $M_{\it{eff}}$. The dependence of the qubit lifetime, $T_1$, with the bias, $\Phi_a$, applied to the coupler can be seen in Eq. 2:

$$T_1(\Phi_a) = Z_0 C_q \left(\frac{L_q}{M_{\it{eff}}(\Phi_a)}\right)^2 \qquad \text{Eq. 2}$$

where $C_q$ represents a capacitance of the qubit 210, $L_q$ represents an inductance of the qubit, and $Z_0$ represents an impedance of the dissipative element, such as the resistive load 219.

Figure 3:
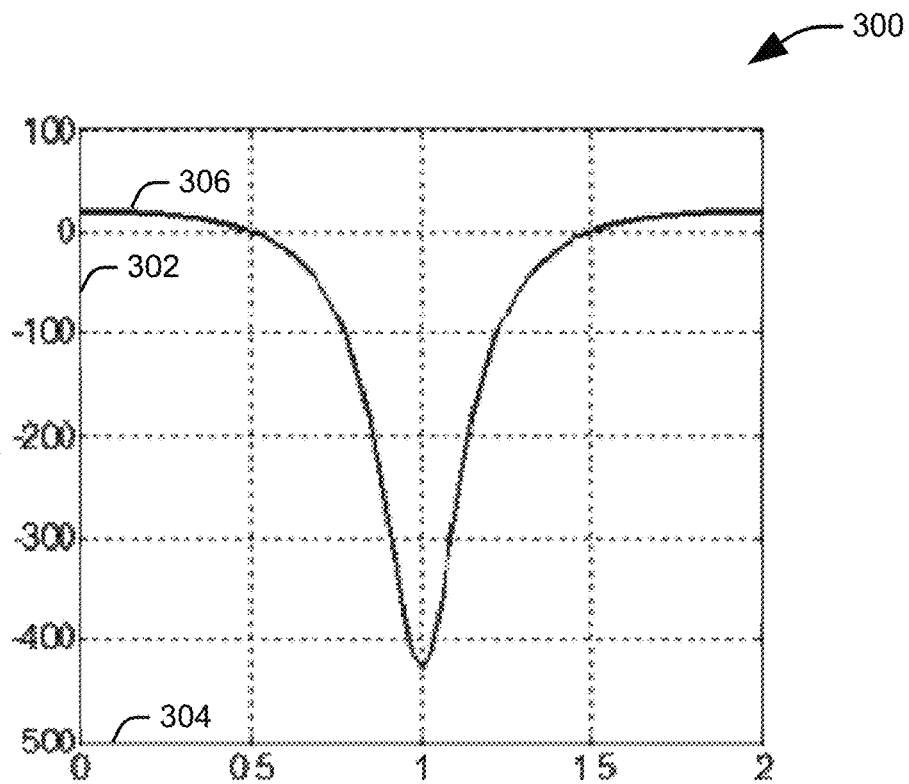
FIG. 3 is a line chart illustrating the variation of the mutual inductance between the qubit and the resistive load, represented in picohenries on the vertical axis, as a function of a provided control flux, represented on the horizontal axis in units of the magnetic flux quantum.

FIG. 3 is a line chart 300 illustrating the variation of the mutual inductance between the qubit 210 and the resistive load 219, represented in picohenries on the vertical axis 302, as a function of the control flux provided to the CJJ 222, represented on the horizontal axis 304 in units of the magnetic flux quantum. For the purposes of the model illustrated in FIG. 3, it is assumed that $M_q$ is one hundred picohenries. From the plotted line 306, it can be seen that that the coupling at $\Phi_a = \Phi_0/2$ is zero, due to the fact that x goes to 0. For $\Phi_0/2 < \Phi_a < \Phi_0$, x takes on a negative value and eventually grows to be much larger, in absolute terms, than it was at $\Phi_a = 0$. In one implementation, this large negative coupling can be exploited to give an enhancement in the absolute coupling strength. When gate operations are performed on the qubit 210, the coupler 220 is turned off by providing a control flux, $\Phi_a = \Phi_0/2$ so that the qubit is isolated from the resistive load 219 and the lifetime of the qubit is not reduced. For reset, a voltage pulse is applied to the $I_a$ line at the bias tee 234 such that the control flux, $\Phi_a$, is raised to $101_0$, thus turning the coupler 220 on. In order to reduce the effects of capacitors on the bias line, the readout can be followed with a negative pulse of equal magnitude on the $I_a$ line.

Figure 4:
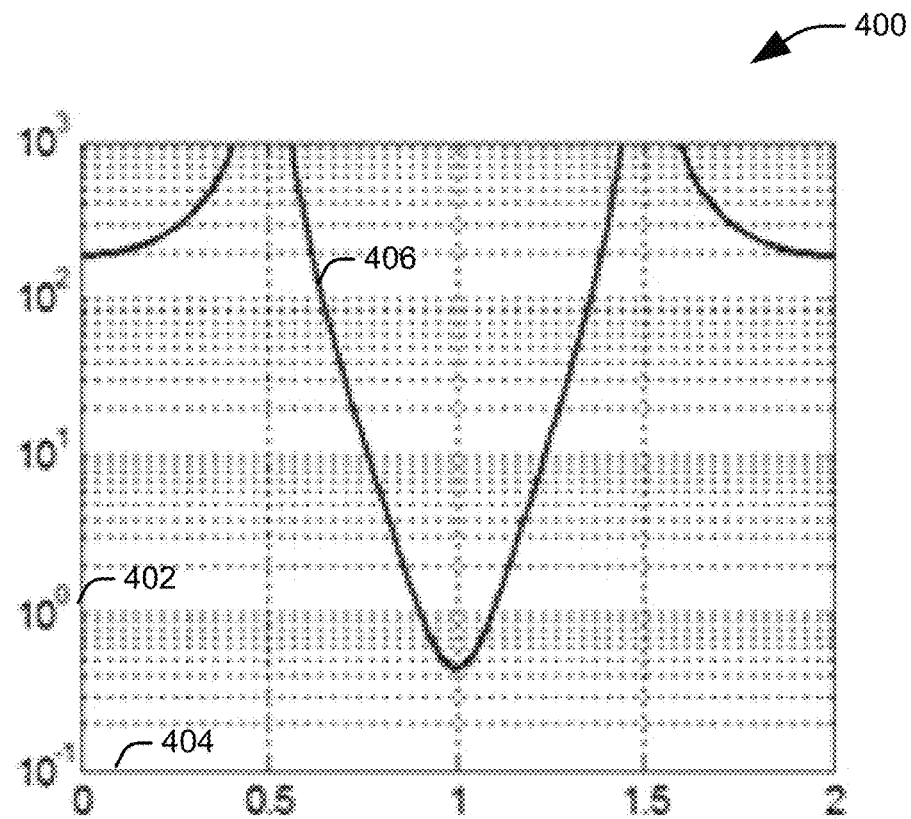
FIG. 4 is a line chart illustrating a projected relaxation time of a qubit, represented logarithmically in nanoseconds on the vertical axis, as a function of a provided control flux, represented on the horizontal axis in units of the magnetic flux quantum.

FIG. 4 is a line chart 400 illustrating a projected relaxation time of the qubit 210, represented logarithmically in nanoseconds on the vertical axis 402, as a function of the control flux provided to the CJJ 222, represented on the horizontal axis 404 in units of the magnetic flux quantum. For the purposes of the model illustrated in FIG. 4, it is assumed that $M_q$ is one hundred picohenries, an energy of the ground to excited transition of the qubit is 9 GHz, an impedance of the resistive load is 50 Ω, and a capacitance of the qubit is 60 fF. From the plotted line 406, it can be seen that that the relaxation time is maximized at $\Phi_a = \Phi_0/2$ and $\Phi_a = 3\Phi_0/2$, where the coupling between the qubit 210 and the dissipative element is minimized. The relaxation time is minimized at $\Phi_a = \Phi_0$, where the coupling is maximized.

Figure 5:
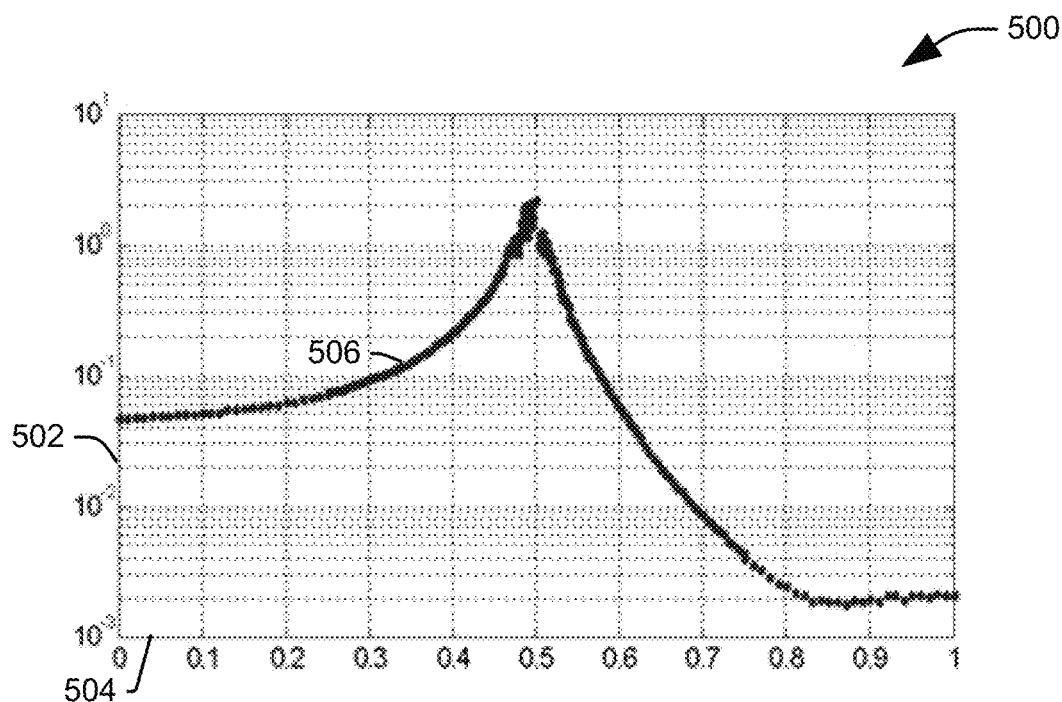
FIG. 5 is a line chart illustrating the measured lifetime, $T_1$, of a qubit, represented logarithmically in microseconds on the vertical axis, as a function of a provided control flux, represented on the horizontal axis 504 in units of the magnetic flux quantum.

FIG. 5 is line chart 500 illustrating the measured lifetime, $T_1$, of the qubit 210, represented logarithmically in microseconds on the vertical axis 502, as a function of the control flux provided to the CJJ 222, represented on the horizontal axis 504 in units of the magnetic flux quantum. From the plotted line 506, it can be seen that a maximum lifetime of 2.2 µs was achieved when the qubit 210 was isolated from the dissipative element and a minimum lifetime of 2 ns was achieved during reset. Accordingly, the qubit lifetime, in this specific implementation, is reduced by a factor of approximately one thousand, although depending on the implementation, the lifetime can be shortened by a factor of between five-hundred and five-thousand. The method appears to be capable of resetting the qubit 210 with at least 99.9% fidelity in less than 20 ns.

The proposed device has been tested via a four-frame measurement intended to reduce the effect of low frequency drift in the readout signal. One frame was a simple $T_1$ decay in which the qubit 210 was π-pulsed and some time was allowed to lapse before measurement. This is referred to as the "no-reset" case in FIG. 6 below. The second was a measurement of the qubit when no π pulse was applied, with some time allowed to elapse before measurement. In a third frame, the qubit 210 was π-pulsed, and a pulse was applied to the reset coupler that set $\Phi_a = \Phi_0$ for some time before measuring. This is referred to as the "reset" case in FIG. 6 below. In a fourth case, the qubit was not excited, but a pulse was still applied to the reset coupler. The magnitude of the integrated transmitted signal through the readout resonator feedline was measured for 1 million samples of the four frames when the reset/wait time was set to 3.5 ns. The reset signal had a 1 ns turn on and turn off with an error function profile, so the shortest delay for all measurements was 2 ns and this 2 ns is included in the reset/wait time.

The measurements were performed using high-power readout, so the readings separated into two distributions due to the bright state behavior of the readout resonator, with the "bright state counts" in one distribution representing a measure of |1>state population. As expected, the bright state counts were highest when an excitation pulse was applied to the qubit, although it will be noted that even when no excitation pulse is applied to the qubit there are some counts in the "bright state" distribution, and the number obtained in the no excitation and no reset frame provides a baseline for the differencing measurement used below. The reset provides a significant drop in the bright state counts when the qubit 210 has been excited, and even a slight reduction in the peak of the distribution for the non-excited case.

Figure 6:
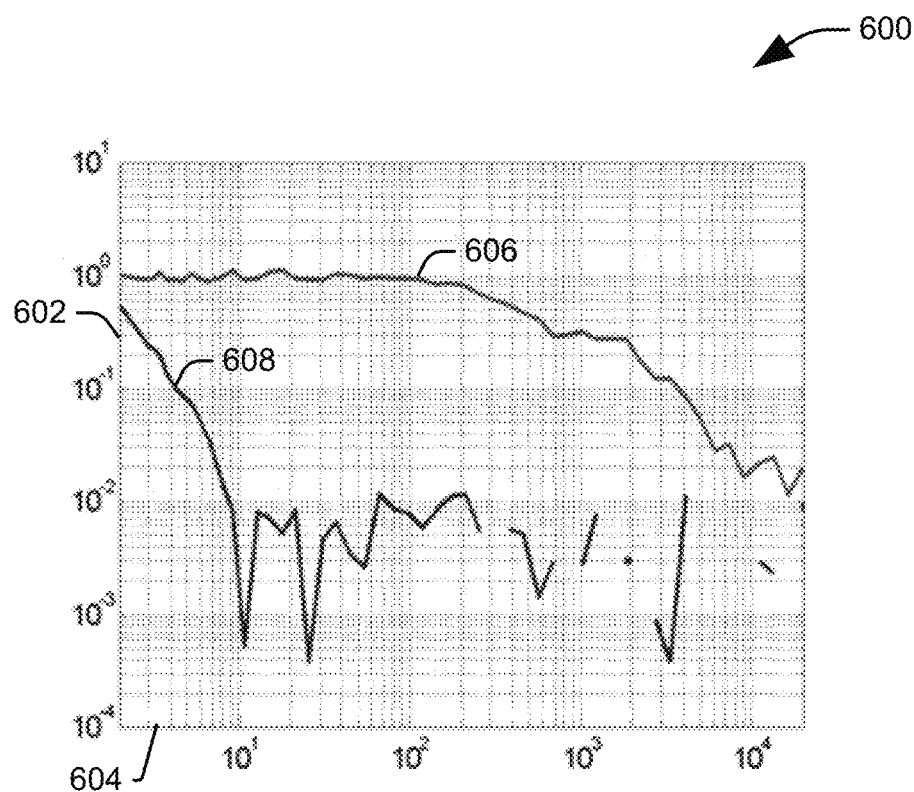
FIG. 6 is a line chart comparing the evolution of the population of the excited state for a qubit after an excitation pulse.

FIG. 6 is a line chart 600 comparing the evolution of the population of the excited state for a qubit after an excitation pulse. A vertical axis 602 represents the fractional population of the excited state, on a logarithmic scale, and the horizontal axis 604 represents time, in nanoseconds, on a logarithmic scale. A first plotted line 606 represents the no-reset case and the second plotted line 608 represents the reset case. The data for each case are normalized to the difference between the no reset measurement and the no excitation with reset measurement taken with a 100 ns reset time. It will be appreciated that the reset curve decays to the noise floor of the measurement by 10 ns, as would be expected for a $T_1$ equal to 2 ns. Unfortunately, the noise on the measurement is such that although some measurements at reset times of >10 ns fall below 0.1%, the scatter in the data gives an error bar of about 0.5%.

Figure 7:
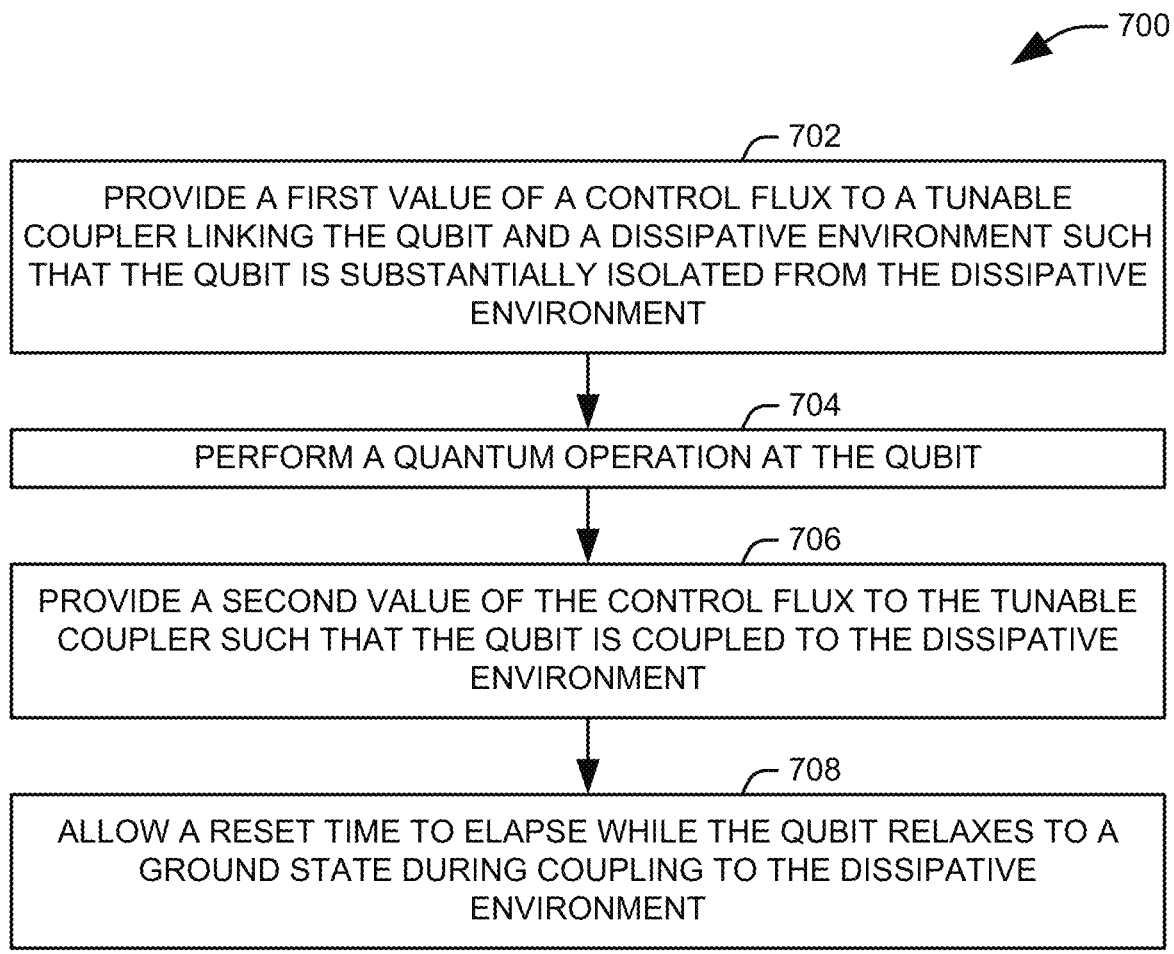
FIG. 7 illustrates one example of a method for operating a qubit.

In view of the foregoing structural and functional features described above, an example method will be better appreciated with reference to FIG. 7. While, for purposes of simplicity of explanation, the example method of FIG. 7 is shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 7 illustrates one example of a method 700 for operating a qubit. At 702, a first value of a control flux is provided to a tunable coupler linking the qubit and a dissipative element such that the qubit is substantially isolated from the dissipative element. In one example, the tunable coupler includes a superconducting loop interrupted by a compound Josephson junction, and the first value of the control flux is provided to the compound Josephson junction. At 704, a quantum operation is performed at the qubit. At 706, a second value of the control flux is provided to the tunable coupler such that the qubit is coupled to the dissipative element. In one implementation, the first value of the control flux is substantially equal to one-half of a flux quantum, and the second value of the control flux is greater than one-half of a flux quantum and less than or equal to the flux quantum. The second value of the control flux can be selected to provide a strong, negative coupling between the qubit and the dissipative element. At 708, a reset time is allowed to elapse while the qubit relaxes to a ground state during coupling to the dissipative element. The reset time can be between 5 ns and 20 ns, and in one implementation, a reset time substantially equal to 10 ns can be used.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A qubit apparatus comprising:
   a load comprising a circuit element having an impedance with a non-vanishing real part;
   a qubit;
   a compound Josephson junction coupler coupling the qubit to the load; and
   a coupling controller that controls the coupling strength of the compound Josephson junction coupler such that a coupling between the qubit and the load is a first value when a reset of the qubit to a ground state is desired and a second value during operation of the qubit.

2. The qubit apparatus of claim 1, wherein the first value represents a strong coupling between the qubit and the load, and the second value represents substantial isolation of the qubit from the load.

3. The qubit apparatus of claim 2, wherein the first value represents a mutual inductance between the qubit and the load having a magnitude twenty and four hundred fifty picohenries and the second value represents a mutual inductance between the qubit and the load that is substantially equal to zero.

4. The qubit apparatus of claim 2, wherein the first value represents a strong, negative coupling between the qubit and the load.

5. The qubit apparatus of claim 1, wherein the coupling controller provides a control flux to the compound Josephson junction coupler to control the coupling strength via at least one control line.

6. The qubit apparatus of claim 5, wherein the compound Josephson junction coupler comprises a superconducting loop interrupted by a compound Josephson junction and the at least one control line comprises a first control line that provides a first control flux to the compound Josephson junction.

7. The qubit apparatus of claim 6, wherein the coupling controller provides the first control flux to be greater than one-half of a flux quantum and less than or equal to the flux quantum to provide the first value for the coupling strength and provides the first control flux as substantially equal to one-half of the flux quantum to provide the second value for the coupling strength.

8. The qubit apparatus of claim 1, wherein the qubit is a transmon qubit.

9. The qubit apparatus of claim 1, wherein each of the qubit, the compound Josephson junction coupler, and the load are configured such that the qubit has a first lifetime when the coupling between the qubit and the load is the first value and the qubit has a second lifetime when the coupling between the qubit and the load is the first value, the first lifetime being between five-hundred and five thousand times longer than the second lifetime.

10. The qubit apparatus of claim 1, wherein the compound Josephson junction coupler coupling the qubit to the load through a transmission line.

11. The qubit apparatus of claim 1, wherein the compound Josephson junction coupler is coupled to each of the load and the qubit via a mutual galvanic inductance.

12. A qubit apparatus comprising:
    a load, comprising a circuit element having an impedance with a non-vanishing real part;
    a qubit;
    a compound Josephson junction coupler coupling the qubit to the load; and
    a coupling controller that controls the coupling strength of the compound Josephson junction coupler such that a coupling between the qubit and the load is a first value, providing a strong coupling between the qubit and the load, when a reset of the qubit to a ground state is desired and a second value, representing substantial isolation of the qubit from the load, during operation of the qubit.

13. The qubit apparatus of claim 12, wherein the coupling controller provides a control flux to the compound Josephson junction coupler to control the coupling strength via at least one control line.

* * * * *